United States Patent [19]
Huhne

[11] Patent Number: 5,443,861
[45] Date of Patent: Aug. 22, 1995

[54] PROCESS FOR MANUFACTURE OF SYNTHETIC DIAMOND LAYERS ON SUBSTRATES

[75] Inventor: Erwin D. Huhne, Schallstadt, Germany

[73] Assignee: UTP Sshweissmaterial GmbH & Co. KG, Krozingen, Germany

[21] Appl. No.: 136,595

[22] Filed: Oct. 14, 1993

Related U.S. Application Data

[63] Continuation of Ser. No. 878,544, May 5, 1992, abandoned.

[30] Foreign Application Priority Data

May 16, 1991 [DE] Germany ............... 41 15 930.6

[51] Int. Cl.6 .................................... C23C 16/26
[52] U.S. Cl. .................................... 427/249; 427/587; 427/223
[58] Field of Search .............. 427/249, 38, 39, 587, 427/223; 428/408

[56] References Cited

U.S. PATENT DOCUMENTS 4,104,441 8/1978 Fedoseev et al. ............... 427/249
4,767,608 8/1988 Matsumoto et al. ............ 427/113
4,938,940 7/1990 Hirose et al. .................. 427/249
4,999,225 3/1991 Rotolico et al. ............... 427/423

FOREIGN PATENT DOCUMENTS 1164795 6/1989 Japan.
1286993 11/1989 Japan.
218391 1/1990 Japan.

Primary Examiner—Shrive Beck
Assistant Examiner—Bret Chen
Attorney, Agent, or Firm—Staas & Halsey

[57] ABSTRACT

A method for the production of polycrystalline diamond coatings, in which carbon from a carbon-containing gas mixture is precipitated onto a substrate heated to a preselected temperature, wherein the substrate is disposed inside a coolable detonation-combustion chamber of a high-velocity burner system or in a detonation gun and an atmosphere preventing oxidation of the surface of the substrate is created and this inert gas atmosphere is then replaced by a carbon-rich detonation mixture atmosphere. The method can also be implemented, if desired, with use of a high-velocity burner system without a combustion chamber and without a detonation gun.

25 Claims, 2 Drawing Sheets

PROCESS FOR MANUFACTURE OF SYNTHETIC DIAMOND LAYERS ON SUBSTRATES

This application is a continuation, of application Ser. No. 07/878,544, filed May 5, 1992, now abandoned.

BACKGROUND AND SUMMARY OF INVENTION

Owing to the special physical properties of diamonds, especially to their extreme hardness, a large percentage of the natural rough diamonds mined are used in technical applications, such as, for example, in tools for machining high-hardness materials by grinding, drilling or cutting. The high demand for diamonds for technical purposes has led to the development of a variety of methods for the fabrication of industrial diamonds and the application of thin layers of synthetic diamond to substrates. Synthetically manufactured diamond coatings are used primarily to increase the hardness of tools for applications in light engineering and microtechnology.

Thin layers of diamond can be created by means of the CVD (chemical vapor deposition) method or by plasma-supported processes. This process technology makes it possible to produce synthetic diamond coatings at low pressures of roughly 0.01 to 100 torr and at moderate substrate temperatures of approximately 800° to 1000° C.

European Patent Application 0 413 394 describes a method for the production of polycrystalline diamond coatings wherein diamond crystallite is precipitated by CVD onto a substrate heated to a temperature in the range of 450° to 1200° C., under pressure in the range of $10^{-5}$ to 1 bar, from a gas phase containing hydrogen and, in a ratio of up to 30%, a carbon-containing gas. To accomplish this, the substrate is brought into contact with a gas phase whose energy content varies with time. At least at the beginning of the deposition process, the energy content of the gas phase must be suitable for the nucleation of diamond crystallites in order for diamond crystallites to form on the surface of the substrate. For additional diamond crystallite to be formed in situ on the known substrate surface, the substrate must be brought into contact with a gas phase whose energy content is elevated in comparison to the initial state.

"Combustion Synthesis of Diamond," W.A. Yarbrough et al., *Surface and Coatings Technology* 39/40 (1989), pp. 241-252, proposes the use of an unmodified oxygen-acetylene soldering and welding torch to fabricate diamond coatings. Because of the high temperature of the gas, the substrate or substrate holder is water-cooled.

The torch is operated at a pressure of 25 to 50 torr and with an oxygen-to-acetylene ratio of roughly 1:16.

European Patent Application 0 379 994 describes a method for the deposition of polycrystalline diamond coatings on a coolable substrate wherein a $C_2H_2$—$O_2$ undercoat is used. The design of the torch and the rate of combustion are not specified in this document.

European Patent Application 0 324 538 describes a method for the deposition of polycrystalline diamond by incomplete combustion in a $C_2H_2$—$O_2$ flame. Here again, neither the design of the torch nor the rate of combustion is specified.

These documents uniformly describe the use of open acetylene-oxygen flames produced by conventional autogenous torches to deposit synthetic diamond coatings.

U.S. Pat. No. 2,714,563 describes a detonation gun and its mode of operation. A single fuel charge or a rapid succession of fuel charges whose composition permits detonation are fed into a gun and then ignited, in order to establish a single detonation or a series of detonations occurring at short time intervals. Particles such as powder are introduced into this gun in such a manner that they are accelerated by the detonation and its associated phenomena and are projected from the open end of the gun onto a surface. A device by which the above-described method can be implemented will be referred to hereinbelow as a detonation gun.

The object of the invention is to provide a method by which synthetic diamond coatings can be produced on substrates rapidly and at low cost, especially with minimal and low-cost equipment. The method according to the invention is also intended to reduce the production costs of synthetic diamond coatings.

In a first method, according to the present invention the substrate to be coated is placed directly in the cooled, (preferably water-cooled), detonation chamber of a high-velocity burner system. The substrate can be a metal or metalloid substrate, such as a silicon wafer, for example.

However, the substrate material can also be, for example, metal oxides, mineral substances or a ceramic. The substrate is either fixedly secured or movably disposed, depending on the application. The detonation chamber is filled with suitable oxidation preventing gases hereinafter referred to as inert gases, i.e., an atmosphere is initially created which prevents oxidation of the substrate. The substrate is heated to a preselected process temperature and maintained as constantly as possible at this temperature. This can be accomplished, for example, by electrical resistance heating or induction heating. The atmosphere in the detonation chamber prevents the surface to be coated from oxidizing during the heating of the substrate.

The detonation chamber possesses one or more inlet valves for the fuel gases and outlet valves for the exhaust gases, which open into discharge conduits. The inlet and outlet valves are actuated via a camshaft in coordination with the work cycle of the process, especially the detonation frequency. Connected upstream from this detonation chamber is a gas mixing chamber, which also has one or more camshafts to control the inlet and outlet valves for the fuel gases, which are opened or closed synchronously with the process and with the inlet and outlet valves of the detonation chamber. The actual coating of the prepared, heated substrate surface takes place as follows:

One or more hydrocarbon gases such as, for example, acetylene or propane gas, and oxygen, either premixed or separately premixed, are injected into the gas mixing chamber through the open inlet valves. In the case of acetylene and oxygen, the ratio of the components of the mixture can range from 1:1 to roughly 2:1, while with the use of propane gas-oxygen mixtures, the mixture ratio varies from 1:2 to 1:4.35. At this stage the inlet valves between the gas mixing chamber and the detonation chamber are closed, so that a chamber pressure of, for example, 1.5 bar prevails in the gas mixing chamber when the system is being operated on acetylene and oxygen, and 4.5 bar, for example, with the use of a propane gas-oxygen mixture. The inlet valves of the gas mixing chamber are initially closed to permit charging with the fuel gases. In the next step, the outlet valves from the detonation chamber to the discharge conduits are opened. This allows argon and other inert gases to escape through the discharge conduits.

The inlet valves between the gas mixing chamber and the detonation chamber are then opened, so that the carbon-rich detonation mixture can flow into the detonation chamber with its reduced pressure, and thereby ignite at the preheated substrate, burning explosively. Carbon in the form of graphite is thus deposited on the substrate surface and is transformed into diamond crystals due to the high substrate temperature and the detonation pressure. The combustion gases, heated to a high temperature, flow out through the discharge conduits, the outlet valves being open. After this operation, the inlet valves between the gas mixing chamber and the detonation chamber are closed again and the process is repeated as described, in accordance with the preselected detonation frequency and process duration.

With a second method according to the invention, synthetic diamond coatings can also be produced on substrates outside the detonation-combustion chamber by means of a high-velocity hydrocarbon-oxygen flame from a high-velocity burner system or an intermittent detonation flame generated by a detonation gun. The substrate to be coated is rotatably mounted, for example in a barrel open at both ends. This barrel is designed as a protectively jacketed barrel, for this application as a double-jacket or triple-jacket barrel of radial chamber construction. A first jacket or first chamber is used for the inert gas, and the second jacket or second chamber for the coolant. The rotatably or axially movable substrate situated in the center of the protective barrel is first heated to the desired process temperature, of approximately 450° to 1200° C., for example inductively or by electrical resistance heating, while inert gas flows out of the inner jacket of the protective barrel through axial bores. This inert gas prevents the oxidation of the substrate surface during the heating process. Next, either a high-velocity, surplus-gas flame is produced by means of a high-velocity burner system operated with a hydrocarbon-oxygen mixture, or an intermittent flame is generated by means of a detonation chamber. The substrate is so moved with a defined radial rotation and a proportionate axial course that the high-velocity flame or the intermittent detonation flame sweeps over the entire substrate surface to be coated while maintaining an adjustable distance therefrom. Between the flame outflow bore and the protectively jacketed barrel, the flame is outwardly shielded and conveyed into a water-cooled jacketed barrel.

Free carbon in the form of graphite precipitates out of the carbon-containing flame onto the preheated substrate surface and is transformed into diamond crystals as a result of the high pressure of the flame on the substrate surface exposed thereto. The substrate is maintained at a preselected constant temperature throughout the coating process. This can be accomplished, for example, by means of special cooling nozzles operated with liquid nitrogen or liquid $CO_2$. Carbon dioxide ($CO_2$) can be fed in through the central feed conduit in the nozzle system of the high-velocity torch or the detonation gun as support for the process.

To produce diamond coatings on large substrate surfaces, it is advantageous to work in a chamber filled with inert gas, in which the substrate is preheated to the appropriate process temperature of approximately 450° to 1200° C., for example inductively or by electrical resistance heating. The inert gas chamber contains either a high-velocity burner system or a detonation gun, each operated with a mixture of hydrocarbon gas and oxygen. Intermittent detonation flames can be generated with a detonation gun, in contrast to the continuously burning high-velocity flames created with a high-velocity torch. In both cases the preferred fuel gases are acetylene, propane gas and oxygen.

The mixture ratios of the hydrocarbon gases used and the oxygen are so adjusted as to produce a reducing surplus-gas flame, for example a mixture ratio of 1:1 to 1.8 when acetylene and oxygen are used as the fuel gas. The carbon-containing intermittent detonation flame or the continuously burning high-velocity flame is again passed over the substrate surface at a defined speed and at an adjustable distance. In the exposure area of the carbon-containing flame, carbon is deposited on the substrate, which is maintained at the process temperature as much as possible, and this carbon is transformed into diamond crystals under the high pressure of the flame. This process can be supported by the addition of very finely powdered graphite, which is introduced into the flame in combination with a suitable carrier gas.

In the method according to the invention, a high-velocity torch or a detonation gun is used instead of the conventional autogenous torches used in the methods of prior art. The flame pressure or detonation pressure on the heated substrate surface is 20 to 100 times higher than in previous technologies. This brings about much more rapid diamond crystallization than in the methods of prior art. As a result, thicker synthetic diamond coatings can be created with the same process duration, or, with the technology of the invention, the process duration can be reduced by 1000 to 2000% from that of the methods of prior techniques.

The method according to the invention can advantageously be implemented with the combustible hydrocarbon gases and noncombustible inert gases listed below:

Combustible Hydrocarbon Gases

1. Acetylene—$C_2H_2$
2. 1,3-butadiene 2,5—$C_4H_6$
3. Butane 2,5 (N-butane)—$C_4H_{10}$
4. I-butene 2,3—$C_4H_8$
5. cis-2-butene—$C_4H_8$
6. trans-2-butene—$C_4H_8$
7. 1,1,-difluoroethane R 152a—$C_2H_4F_2$
8. Dimethylamine—$C_2H_7N$
9. 2,2-dimethylpropane—$C_5H_{12}$
10. Ethene—$C_2H_6$
11. Ethene—$C_2H_4$
12. Isobutane—$C_4H_{10}$
13. Isobutene—$C_4H_8$
14. Methane—$CH_4$
15. Methyl vinyl ether—$CH_3$—O—$CH=CH_2$
16. Propane—$C_3H_8$
17. Propene—$C_3H_6$ Noncombustible Inert Gases 1. Argon—Ar
2. Arsine—$AsH_3$
3. Helium—He
4. Helium-3 He [sic]
5. Hexafluoroethane R 116—$C_2F_6$ 6. Carbon dioxide—$CO_2$
7. Krypton—Kr
8. Neon—Ne
9. Xenon—Xe Exemplary embodiments of the invention are illustrated in the drawing and are explained in greater detail in the description which follows.

DESCRIPTION OF THE PREFERRED EMBODIMENT

Figure 1:
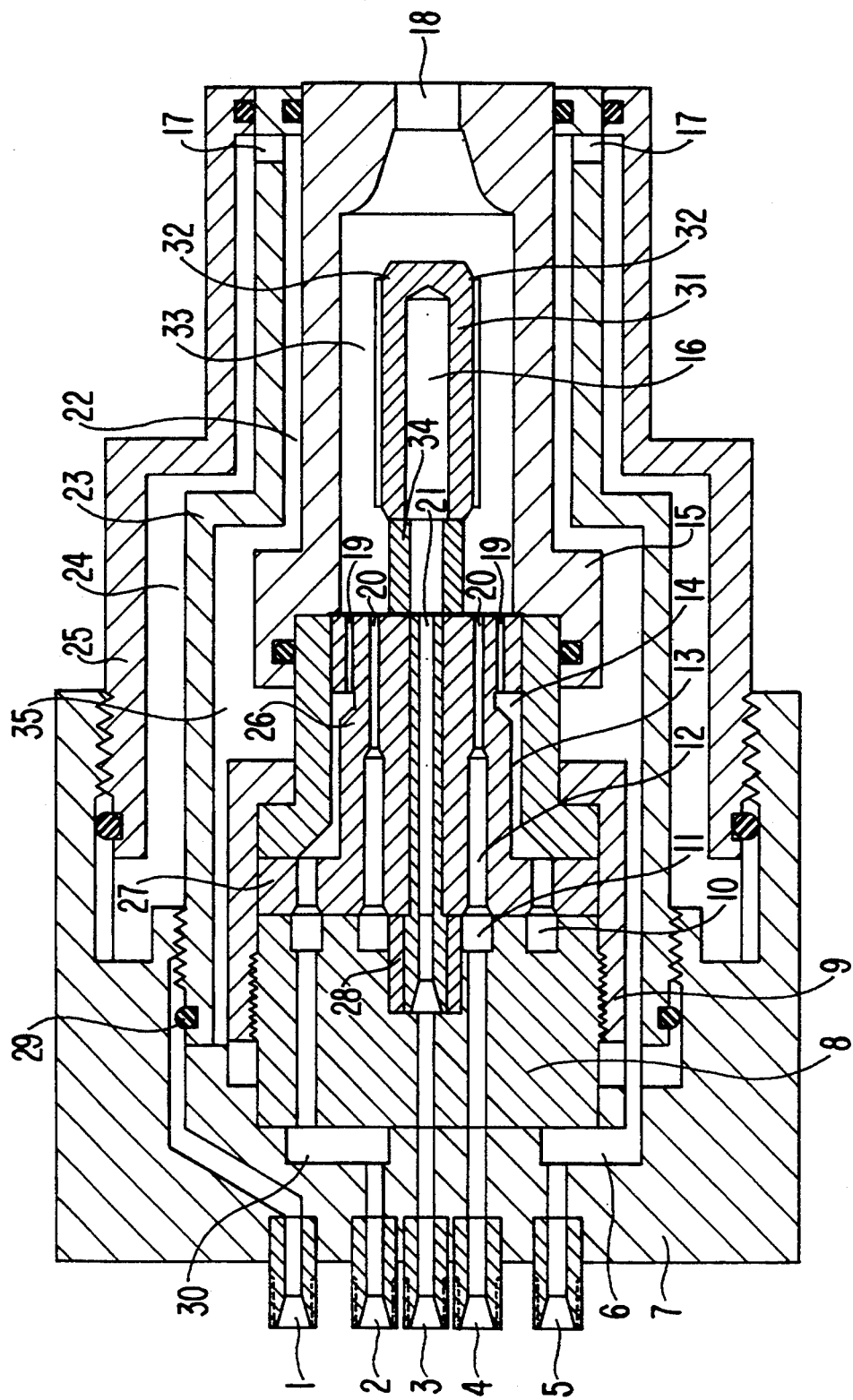
FIG. 1 is a transverse sectional view of a high-velocity burner system with detonation-combustion chamber.
Figure 2:
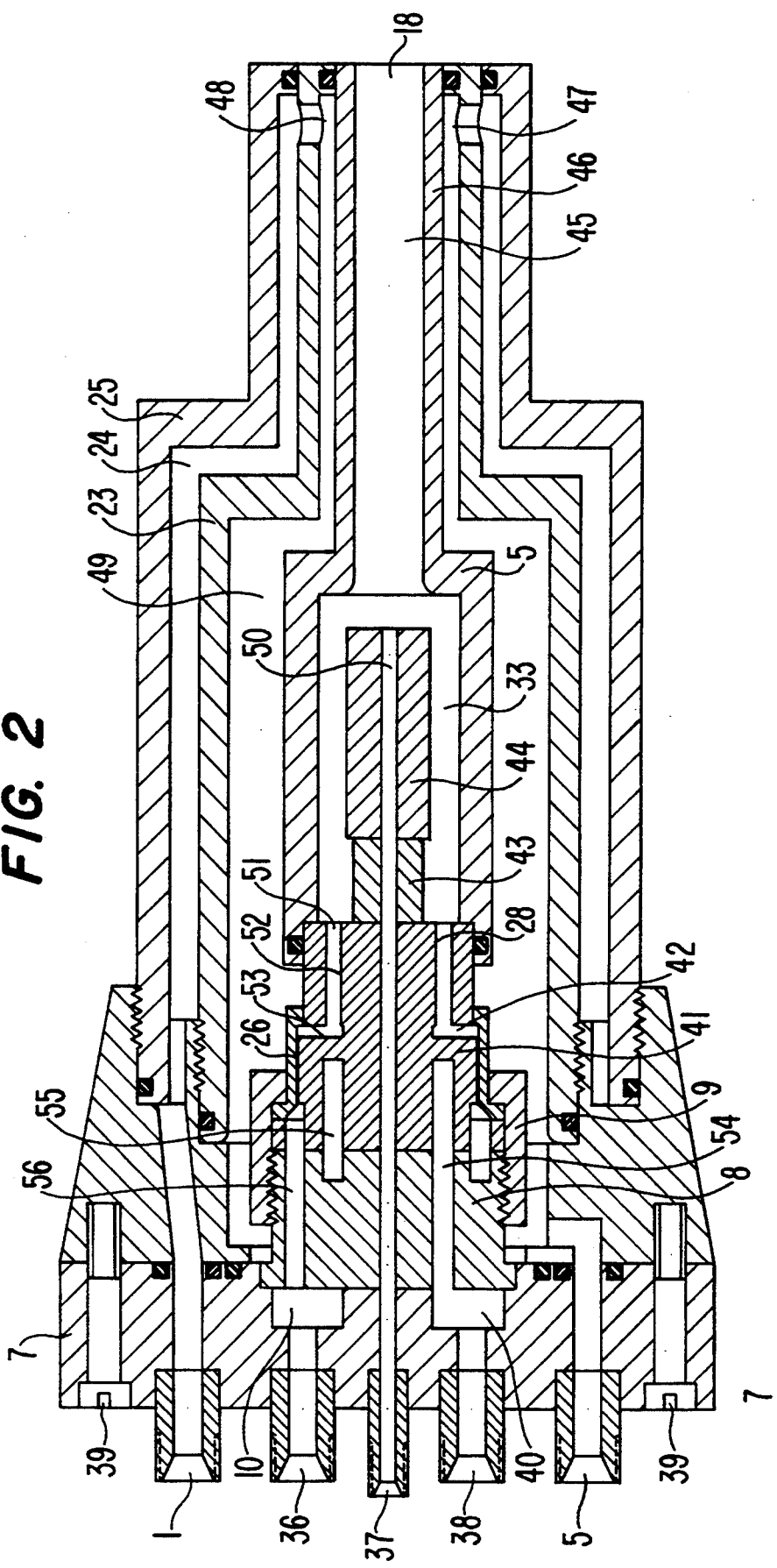
FIG. 2 is a transverse sectional view of an additional high-velocity burner system with detonation-combustion chamber.

Each of the high-velocity burner systems shown in FIGS. 1 and 2 has a cylindrical detonation-combustion chamber 33, which is provided at one end face with an outlet bore 18 serving as a discharge conduit.

Abutting the other end face of the detonation-combustion chamber 33 is a gas mixing block 26 connected to a gas mixing block holder 8. These structural elements are surrounded by a casing 15; 3, 5, which encloses at least parts of a cooling water circuit.

In the cylindrical detonation-combustion chamber volume 33 of the exemplary embodiment shown in FIG. 1, a substrate holder 31 holding a substrate 32 and provided with a cylindrical coolant cavity 16 is so fastened that located between the gas mixing block 26 and the substrate holder 31 is an insulating collar 34, whose end face is disposed against the gas mixing block 26. A thermometric probe is integrated into the inner wall of the combustion chamber of the substrate holder 31 via a connector through a bore 21, which penetrates through the gas mixing block 26 and opens into the insulating collar 34, to which in turn the cylindrical cavity 26 of the substrate holder 31 is connected.

The thermometric probe is connected to an electronic measurement analysis and control device. In addition, during the process, coolant is fed into and discharged from the cylindrical cavity 16 of the substrate holder 31 via the connector 3 and the bore 21. This enables the temperature of the substrate 32 to be maintained constant at a preselected level.

Coolant which reaches the outer wall of the casing 15 of the detonation-combustion chamber, with the expanding nozzle bore 18, via a cooling-water annulus 27 and via a plurality of radial cooling-water bores 17, is fed into the apparatus at a connector 1 and cools the entire detonation-combustion chamber from the outside, as it flows back through annuli 22 and 35. The cooling water heated during the process passes through a connector 5 to a cooling block system, where it is cooled to a temperature of roughly 16° to 18° C. From the cooling block the cooling water passes into a loop and back to connector 1.

Pure hydrogen or a mixture of hydrogen and oxygen is then fed into the apparatus at a connector 2. The hydrogen or the mixture passes through a radial pressure-equalizing chamber 30 via a plurality of radial-axial bores into an annular groove 10 of a gas mixing block holder 8 on which the gas mixing block 26 is disposed. Pressure equalization takes place in the annular groove by radial distribution of the gas. The hydrogen or the mixture flows through a plurality of axial bores proceeding from the annular groove 10 through an annulus 13 into a radial groove 14, and then, finely distributed via a plurality of axial bores 19, reaches the detonation-combustion chamber volume 33 and exits from the expanding nozzles 18.

The amount of fuel gas present at the start of the process is selected in such a way that the volume flow of the hydrogen or hydrogen-oxygen mixture is so small that the flame flashes back into the detonation-combustion chamber volume 33 on ignition of the gas exiting from the expanding nozzle 18. In so doing, the hydrogen or hydrogen-oxygen flame sweeps over the entire surface of the substrate 32, causing it to be heated. In this state, the amount of hydrogen or hydrogen-oxygen mixture fed in is substantially increased due to the higher pressure, and the pressure in the combustion chamber increases proportionately as a result. This produces a high-velocity $H_2$ or $H_2+O_2$ flame, which heats the substrate to a preselected process temperature of approximately 450° to 1000° C. and simultaneously protects it against oxidation. The process temperature is kept constant by appropriate control of the amounts of coolant fed into the inside of the substrate holder 31 and by appropriate control of the fuel gases.

As soon as the required substrate temperature has been reached, a hydrocarbon-oxygen mixture, preferably acetylene ($C_2H_2$) and oxygen ($O_2$) in a mixture ratio of 1:1 to roughly 2:1, is fed in through a connector 4. If other hydrocarbon-oxygen mixtures are used, the mixture ratio is so selected that a carbon-containing flame atmosphere is created. The hydrocarbon mixture ($C_2H_2+O_2$) passes into a radial groove 11, which serves as the pressure-equalizing chamber and mixing unit for the fuel gases.

From there the mixture of fuel gas and oxygen flows out through a plurality of axial bores 12 whose end faces are disposed radially and concentrically around the substrate 32, and ignites. In this phase of the process, the infeed of hydrogen or the hydrogen-oxygen mixture at connector 2 is interrupted, so that a carbon-enriched high-velocity $C_2H_2+O_2$ flame burns in the detonation-combustion chamber volume 33, thus producing a high pressure in the detonation-combustion chamber. This causes the deposition on the surface of the substrate 32 of a graphite phase which is transformed into diamond crystals as a result of the high pressure in the combustion chamber and the preselected substrate temperature. The method of the invention is so controlled in an intermittent cycle that a hydrogen or hydrogen-oxygen high-velocity flame and an acetylene-oxygen flame are produced in alternation. The hydrogen or hydrogen-oxygen high-velocity flame suppresses the deposition of graphite and promotes the growth of diamond crystals. The edge crystals multiply and grow as a function of the duration of the process and the substrate temperature.

The method described hereinabove can be varied as follows:

The infeed of the fuel gases, acetylene+oxygen and hydrogen or hydrogen+oxygen, in the preselected mixing proportions takes place 4 to 20 times/sec, alternating in cycles in which the shutoff valves for the gas infeed are opened and closed by motors.

The acetylene-oxygen mixture, or the hydrogen or hydrogen-oxygen mixture, flows into the detonation-combustion chamber at the aforesaid intervals. In the interrupted cycles, the infeed of fuel gases extinguishes the flame each time. When the gas valves are reopened, the fuel gas-oxygen mixture ignites explosively, and acetylene is decomposed into $C_2$ and $H_2$ by the high pressure of the explosion. The carbon or the graphite phase produced precipitates onto the substrate surface, among other places, and, due to the high pressure in the combustion chamber (explosion pressure) and the substrate temperature, is transformed into diamond crystals. In contradistinction to the first-described process technology, the opening and closing of the gas valves at intervals in the detonation-combustion chamber produces an intermittent detonation flame with a frequency of four detonations per second, which leads to a higher detonation pressure in the combustion chamber. The number of diamond crystals produced in this manner, and their size and density, are influenced by the duration of the process, which affects the thickness of the coating.

Reference numeral 44 in FIG. 2 denotes a substrate holder, which can be implemented, for example, as a molybdenum cylinder. It is so disposed in the detonation chamber 32 that an insulating collar 43 is inserted between the gas mixing block and the substrate holder 44. Cooling water is fed in through a connector 1 and passes through an annulus 24 disposed between an outer screw collar 25 and an inner screw collar 23, and via radial bores 47 and 48 into the cooling-water annulus 49. The cooling water flows out through a connector 5, is cooled in a heat exchanger to a temperature of roughly 18° to 20° C., and is fed, by means of a cooling-water pump, through a system of conduits back to connector 1.

Hydrogen is then fed into the apparatus through a connector 36 and passes through a radial pressure-equalizing chamber 10 and a plurality of axial bores 56 in the gas mixing block holder 8 into an injection ring slot 13/31. Oxygen is fed in through a connector 38 and flows through a radial pressure-equalizing chamber 40 and a plurality of axial bores 21 in the gas mixing block holder 8, at high pressure, through injection discharge nozzle bores 41 [into] the hydrogen-filled injector slot 42/53 at ultrasonic speed. Each of the highly accelerated streams of oxygen flows into one of a plurality of opposing injector mixing nozzle bores 51, and in so doing entrains hydrogen from the injection ring slot 42/53. The hydrogen-oxygen mixture then flows into the detonation-combustion chamber volume 33. The mixture exits through the expanding nozzle bore 45 in the end face of the detonation-combustion chamber, where it is ignited electrically.

Because of the relatively low flow velocity of the hydrogen-oxygen mixture, the flame flashes back into the detonation-combustion chamber 33, where it continues to burn. The substrate mounted inside the detonation-combustion chamber is thereby heated and simultaneously protected against oxidation by the reducing $H_2+O_2$ flame. The substrate holder is connected to a thermometric probe by a connector 37.

In addition, a cooling gas is conveyed into the inside of the substrate holder through the connector 37 and a central bore 50, which penetrates through the gas mixing block holder 8 connected to the gas mixing block and opens into the insulating collar 43, and is so regulated that the substrate temperature is held constant at a preselected value, for example 800° C. As soon as a temperature of 800° C. is reached, a hydrocarbon gas, for example $C_2H_2$, is fed in at connector 36 simultaneously with $H_2$, and the inflow pressure of the $O_2$ at connector 38 is greatly increased. A flame produced by a mixture of $H_2+C_2H_2+O_2$ now burns in the detonation-combustion chamber 33 under the high pressure in said chamber and exits from the expanding nozzle bore 45 in the end face of the chamber at very high velocity. At this stage of the process the infeed of hydrogen is stopped, so that a hydrocarbon-rich $C_2H_2+O_2$ flame burns in the detonation-combustion chamber 33, from which flame carbon in the form of graphite is precipitated onto the heated substrate and is transformed into diamond crystals as a result of the high pressure in the detonation-combustion chamber. In an intermittent cycle the $C_2H_2$ infeed is alternately interrupted and hydrogen fed in to suppress the graphite phase during the formation of the diamond crystals.

The infeed of $C_2H_2+H_2$ can be so regulated that an intermittent detonation can be triggered in the detonation-combustion chamber instead of a continuously burning high-velocity flame. The high pressures thus produced in the detonation-combustion chamber 33 promote the formation of diamond crystals.

I claim:
1. A method for the production of a polycrystalline diamond coating, comprising the steps of:
   (a) mounting a substrate inside a combustion chamber of a high velocity burner system;
   (b) creating an atmosphere preventing oxidation of the surface of the substrate in the combustion chamber by introducing combustible oxidation preventing gas;
   (c) burning the combustible oxidation preventing gas and thereby heating the substrate to a selected substrate temperature between 450° C. and 1200° C. in the atmosphere preventing oxidation, the selected substrate temperature being capable of causing an automatic ignition of a mixture of oxygen and hydrocarbon gas at the substrate;
   (d) replacing the atmosphere preventing oxidation with a combustible carbon containing mixture of gases by introducing said mixture of oxygen and hydrocarbon gas into the combustion chamber;
   (e) allowing said automatic ignition, and maintaining combustion by introducing into the combustion chamber additional amounts of the mixture of oxygen and hydrocarbon gas; and
   (f) maintaining the substrate essentially at the selected substrate temperature,
wherein polycrystalline diamond is coated on the substrate.

2. The method according to claim 1, wherein the combustible oxidation preventing gas is a hydrogen-oxygen mixture with an oxygen content below a stoichiometric oxidation ratio, the combustible oxidation preventing gas being ignited upon exit from the combustion chamber an initial flow velocity of the combustible oxidation preventing gas being selected so that the flame flashes back into the combustion chamber, the initial flow velocity of the combustible oxidation preventing gas being subsequently increased to a flow velocity which will cause a hydrogen-oxygen high velocity flame that heats the substrate to the selected substrate temperature.

3. The method according to claim 1, wherein the hydrocarbon gas includes at least one of acetylene, 1,3-butadiene 2,5, butane 2,5, i-butene 2,3, cis-2-butene, trans-2-butene, 1,1-difluoroethane, dimethylamine, 2,2-dimethylpropane, ethane, ethene, isobutane, isobutene, methane, methyl vinyl ether, propane and propene.

4. The method according to claim 3, wherein the combustible oxidation preventing gas includes at least one of argon, helium, helium-3, hexafluoroethane, carbon dioxide, krypton, neon and xenon.

5. The method according to claim 4, wherein the heating of the substrate is accomplished by electrical resistance heating or induction heating.

6. The method according to claim 1, wherein at least one of carbon dioxide and finely powdered graphite is added to the mixture of oxygen and hydrocarbon gas.

7. A method for the production of a polycrystalline diamond coating, comprising the steps of:
(a) mounting a substrate inside a combustion chamber of a high velocity burner system;
(b) creating an initial atmosphere preventing oxidation of the surface of the substrate in the combustion chamber by introducing oxidation preventing gas;
(c) heating the substrate to a selected substrate temperature between 450° C. and 1200° C. in the initial atmosphere preventing oxidation, the selected substrate temperature being capable of causing an automatic ignition of a mixture of oxygen and hydrocarbon gas at the substrate;
(d) replacing the atmosphere preventing oxidation with a combustible carbon containing mixture of gases by introducing said mixture of oxygen and hydrocarbon gas into the combustion chamber;
(e) igniting the carbon containing mixture of gases at the heated substrate;
(f) creating a further atmosphere preventing oxidation of the surface of the substrate in the combustion chamber by introducing a combustible oxidation preventing gas;
(g) replacing the further atmosphere preventing oxidation with a combustible carbon containing mixture of gases by introducing said mixture of oxygen and hydrocarbon gas into the combustion chamber;
(h) repeating steps (f) and (g) in sequence 4 to 20 times per second; and
(i) maintaining the substrate essentially at the selected substrate temperature,
wherein graphite is deposited during step (g) and the deposited graphite is transformed into diamond during step (f).

8. The method according to claim 7, wherein the atmosphere of oxidation preventing gas is a flow of a hydrogen-oxygen mixture with an oxygen content below a stoichiometric oxidation ratio, the oxidation preventing gas being ignited upon exit from the combustion chamber, an initial flow velocity of the oxidation preventing gas being selected so that the flame flashes back into the combustion chamber, the initial flow velocity of the hydrogen-oxygen mixture being subsequently increased to a flow velocity which will cause a hydrogen-oxygen high velocity flame that heats the substrate to the selected substrate temperature.

9. The method according to claim 7, wherein the hydrocarbon gas includes at least one of acetylene, 1,3-butadiene 2,5, butane 2,5, i-butene 2,3, cis-2-butene, trans-2-butene, 1,1-difluoroethane, dimethylamine, 2,2-dimethylpropane, ethane, ethene, isobutane, isobutene, methane, methyl vinyl ether, propane and propene.

10. The method according to claim 9, wherein the combustible oxidation preventing gas includes at least one of argon, helium, helium-3, hexafluoroethane, carbon dioxide, krypton, neon and xenon.

11. The method according to claim 10, wherein the heating of the substrate is accomplished by electrical resistance heating or induction heating.

12. The method according to claim 7, wherein at least one of carbon dioxide and finely powdered graphite is added to the mixture of oxygen and hydrocarbon gas.

13. A method for the production of a polycrystalline diamond coating, comprising the steps of:
(a) mounting a substrate inside a detonation combustion chamber of a detonation gun;
(b) creating an atmosphere preventing oxidation of the surface of the substrate in the combustion chamber by introducing oxidation preventing gases;
(c) heating the substrate to a selected substrate temperature between 450° C. and 1200° C. in the atmosphere preventing oxidation, the selected substrate temperature being capable of causing an automatic ignition of a mixture of oxygen and hydrocarbon gases at the substrate;
(d) replacing the atmosphere preventing oxidation with a combustible carbon containing mixture of gases by introducing said mixture of oxygen and hydrocarbon gas into the combustion chamber;
(e) igniting the carbon-containing mixture of gases at the heated substrate to burn explosively; and
(f) maintaining the substrate essentially at the selected substrate temperature,
wherein polycrystalline diamond is coated on the substrate.

14. The method according to claim 13, wherein steps (b) through (e) are initially performed in sequence, then subsequently, steps (b), (d) and (e) are repeated in sequence 4 to 20 times per second, to thereby cause a deposition of a polycrystalline diamond coating on the substrate, layer by layer.

15. The method according to claim 13, wherein the atmosphere preventing oxidation is a flow of a hydrogen-oxygen mixture with an oxygen content below a stoichiometric oxidation ratio.

16. The method according to claim 13, wherein the hydrocarbon gas includes at least one of acetylene, 1,3-butadiene 2,5, butane 2,5, i-butene 2,3, cis-2-butene, trans-2-butene, 1,1-difluoroethane, dimethylamine, 2,2-dimethylpropane, ethane, ethene, isobutane, isobutene, methane, methyl vinyl ether, propane and propene.

17. The method according to claim 16, wherein the oxidation preventing gases includes at least one of argon, helium, helium-3, hexafluoroethane, carbon dioxide, krypton, neon and xenon.

18. The method according to claim 16, wherein the heating of the substrate is accomplished by electrical resistance heating or induction heating.

19. The method according to claim 13, wherein at least one of carbon dioxide and finely powdered graphite is added to the mixture of oxygen and hydrocarbon gas.

20. A method for the production of a polycrystalline diamond coating, comprising the steps of:
(a) rotatably mounting a substrate in front of a high velocity burner system or a detonation gun providing an intermittent detonation flame, the substrate being mounted in front of an orifice of the high velocity burner system or the detonation gun;
(b) heating the substrate to a selected substrate temperature between 450° C. and 1200° C. in an atmosphere of oxidation preventing gas;

(c) maintaining the substrate essentially at the selected substrate temperature during the process;
(d) feeding the high velocity burner system or the detonation gun with a mixture of oxygen and hydrocarbon gas;
(e) igniting the flame of the high velocity burner system or the detonation gun;
(f) directing the resulting high velocity flame or the resulting intermittent detonation flame on the substrate, wherein polycrystalline diamond is coated on the substrate.

21. The method according to claim 20, wherein the hydrocarbon gas includes at least one of acetylene, 1,3-butadiene 2,5, butane 2,5, i-butene 2,3, cis-2-butene, trans-2-butene, 1,1-difluoroethane, dimethylamine, 2,2-dimethylpropane, ethane, ethene, isobutane, isobutene, methane, methyl vinyl ether, propane and propene.

22. The method according to claim 20, wherein the oxidation preventing gas includes at least one of argon, helium, helium-3, hexafluoroethane, carbon dioxide, krypton, neon and xenon.

23. The method according to claim 20, wherein the heating of the substrate is accomplished by electrical resistance heating or induction heating.

24. The method according to claim 20, wherein at least one of carbon dioxide and finely powdered graphite is added to the mixture of oxygen and hydrocarbon gas.

25. The method according to claim 20, wherein the substrate has an outer surface and is rotated during at least step (f) so that the flame sweeps over the entire outer surface of the substrate.

* * * * *